United States Patent
Gunturi et al.

(10) Patent No.: US 10,911,057 B2
(45) Date of Patent: Feb. 2, 2021

(54) DIGITAL CLOCK GENERATION WITH RANDOMIZED DIVISION OF A SOURCE CLOCK

(71) Applicant: TEXAS INSTRUMENTS INCORPORATED, Dallas, TX (US)

(72) Inventors: Sarma Sundareswara Gunturi, Bangalore (IN); Jawaharlal Tangudu, Bangalore (IN); Sundarrajan Rangachari, Tamil Nadu (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/680,046

(22) Filed: Nov. 11, 2019

(65) Prior Publication Data

US 2020/0153444 A1 May 14, 2020

(30) Foreign Application Priority Data

Nov. 12, 2018 (IN) .............................. 201841042423

(51) Int. Cl.
*H03L 7/18* (2006.01)
*H04B 1/40* (2015.01)
*H03K 3/84* (2006.01)

(52) U.S. Cl.
CPC ................. *H03L 7/18* (2013.01); *H03K 3/84* (2013.01); *H04B 1/40* (2013.01)

(58) Field of Classification Search
CPC ...... H03K 5/1252; H03K 17/16; H03K 21/08; H03K 3/84; H03L 7/18; H04B 1/40
See application file for complete search history.

(56) References Cited

U.S. PATENT DOCUMENTS

| | | | | |
|---|---|---|---|---|
| 4,571,556 | A * | 2/1986 | Gnerlich | H03K 3/84 331/78 |
| 8,102,897 | B1 * | 1/2012 | Mower | H04B 1/707 375/146 |
| 10,218,338 | B1 * | 2/2019 | Klemmer | H03K 5/1252 |
| 10,651,863 | B1 * | 5/2020 | Rangachari | H03K 21/10 |
| 2015/0117573 | A1 * | 4/2015 | May | H04B 1/12 375/346 |
| 2017/0366385 | A1 * | 12/2017 | Roger | H04L 27/10 |
| 2019/0372747 | A1 * | 12/2019 | Choo | G06F 1/10 |

* cited by examiner

*Primary Examiner* — Khanh C Tran
(74) *Attorney, Agent, or Firm* — John R. Pessetto; Charles A. Brill; Frank D. Cimino

(57) ABSTRACT

A digital clock generator for a digital clock domain interfaced to another clock domain through a FIFO, includes division selector circuitry to provide an input randomizing sequence of clock division factors, selected from a defined set of clock division factors corresponding to a target average clock division, and division arbitration circuitry to generate a drift-corrected randomizing sequence of clock division factors, based at least in part on the input randomizing sequence of clock division factors, and an accumulated drift correction signal. A clock drift control loop generates the accumulated drift correction signal, based at least in part on an accumulated clock drift relative to the target average clock division. Clock generation can be based on randomized division with the drift-corrected randomizing sequence of clock division factors. The drift-corrected randomizing sequence of clock division factors can be generated so that clock drift is bounded based on a FIFO depth.

23 Claims, 7 Drawing Sheets

DIGITAL CLOCK GENERATION WITH RANDOMIZED DIVISION OF A SOURCE CLOCK

CROSS-REFERENCE TO RELATED APPLICATIONS

Priority is claimed under 37 CFR 1.78 and 35 USC 119(e) to INDIA Provisional Application 201841042423, filed 2018 Nov. 12, which is incorporated by reference in its entirety.

BACKGROUND

In mixed signal systems with analog and digital clock domains, to achieve optimal area and power, the digital logic can be designed to operate at a significantly lower frequency than the analog circuitry. For example, in an RF TX or RX (or transceiver TX/RX), where the analog TX or RX commonly operate in the GHz range, the digital logic can be designed to operate in the range of hundreds of MHz, such as for interpolation/decimation, digital pre-distortion (DPD), quadrature (IQ) mismatch compensation (or other correction of analog impairments).

Digital clock spurs coupling to the analog modules can significantly impact the ability to meet operational/performance specifications. Digital clock spur coupling can be mitigated by frequency planning in the digital clock architecture, by generating the lower frequency digital clock by a pseudorandom (non-uniform) division of the high frequency source clock used in the analog clock domain.

A FIFO is required at the interface between analog and digital clock domains, to hand-off data from/to a uniform analog source clock to a non-uniform digital clock. The FIFO is designed for a given FIFO depth to avoid overflow/underflow, which should be minimized to conserve area.

One approach for spur reduction is to use non-uniform division by random (pseudorandom) sequence, for example, division of a source clock CLK=1.5 GHz by a randomized sequence [3,4,5] to provide CLK_by_4=375 MHz. Randomized division suppresses spurs other than at the sourced clock frequency, simplifying filters. However, accumulated drift of the randomized low frequency clock (relative to a uniform clock) becomes unbounded, causing FIFO overflow/underflow.

Another approach that avoids accumulated drift due to randomization is division by a fixed sequence, for example, pulse swallowing for a permutation of [3,4,5]. However, the generated digital clock has poor attenuation of the low frequency spurs which can couple to the analog.

While this Background information references RF communications, this Patent Disclosure is more generally directed to mixed signal designs, or designs with data transfer between clock domains through a FIFO interface.

BRIEF SUMMARY

This Brief Summary is provided as a general introduction to the Disclosure provided by the Detailed Description and Drawings, summarizing aspects and features of the Disclosure. It is not a complete overview of the Disclosure, and should not be interpreted as identifying key elements or features of, or otherwise characterizing or delimiting the scope of, the disclosed invention.

According to aspects of the Disclosure, apparatus and methods are described for digital clock generation for a digital clock domain receiving data through a FIFO interface, with randomized division (integer or fractional) of a source clock based on a drift-corrected randomizing sequence of clock division factors, so that clock drift is bounded based on a selected FIFO depth.

According to other aspects of the Disclosure, a method of generating a digital clock for a digital clock domain interfaced to another clock domain through a FIFO (first in first out) component, based on randomized division of a source clock, includes: generating an input randomizing sequence of clock division factors, selected from a defined set of clock division factors corresponding to a target average clock division value; generating an accumulated drift correction signal, based at least in part on an accumulated clock drift value relative to the target average clock division value; generating a drift-corrected randomizing sequence of clock division factors, based at least in part on the input randomizing sequence of clock division factors, and the accumulated drift correction signal; and generating the digital clock from the source clock based on randomized division with the drift-corrected randomizing sequence of clock division factors. The drift-corrected randomizing sequence of clock division factors can be generated so that clock drift is bounded based on the defined FIFO depth.

According to other aspects of the Disclosure, a circuit for use in generating a digital clock for a digital clock domain interfaced to another clock domain through a FIFO (first in first out) component, is based on randomized division of a source clock. The circuit includes division selector circuitry to provide an input randomizing sequence of clock division factors, selected from a defined set of clock division factors corresponding to a target average clock division value, and further includes division arbitration circuitry to generate a drift-corrected randomizing sequence of clock division factors, based at least in part on the input randomizing sequence of clock division factors, and an accumulated drift correction signal. A clock drift control loop can be used to generate the accumulated drift correction signal, based at least in part on an accumulated clock drift value relative to the target average clock division value. The circuit can be included in a clock generator circuit to generate the digital clock from the source clock based on randomized division with the drift-corrected randomizing sequence of clock division factors. The drift-corrected randomizing sequence of clock division factors can be generated so that clock drift is bounded based on the defined FIFO depth.

According to other aspects of the Disclosure, the method of generating a digital clock can be used in a radio frequency communications device that includes an analog signal chain in an analog clock domain, and a digital signal chain in a digital clock domain, an interface circuit between the analog clock domain and the digital clock domain, the interface including a FIFO component, and a digital clock generator circuit to generate the digital clock from a source clock. The digital clock generator circuit can include division selector circuitry to provide an input randomizing sequence of clock division factors, selected from a defined set of clock division factors corresponding to a target average clock division value, and division arbitration circuitry to generate a drift-corrected randomizing sequence of clock division factors, based at least in part on the input randomizing sequence of clock division factors, and an accumulated drift correction signal. A clock drift control loop can be used to generate the accumulated drift correction signal, based at least in part on an accumulated clock drift value relative to the target average clock division value. The digital clock generator circuit can be used to generate the digital clock from the source clock based on randomized division with the drift-corrected randomizing sequence of clock division factors.

The drift-corrected randomizing sequence of clock division factors can be generated so that clock drift is bounded based on the defined FIFO depth.

Other aspects and features of the invention claimed in this Patent Document will be apparent to those skilled in the art from the following Disclosure.

BRIEF DESCRIPTION OF THE DRAWINGS

FIG. 2 illustrates an example digital clock generator 100 with randomized non-uniform clock divider 110, and a clock division factor block 120, including a randomized division factor selector 130 (with LFSR1 input 132), and including a division factor arbitration block 200 with a division factor arbitration mechanism 210 (with LFSR2 input 212), and a drift-controlled arbitration feedback loop 220 (including clock drift accumulator 221 and drift control 224), to alter the clock division factor randomizing sequence (example, {3, 4, 5}), based on clock drift accumulation, and generate a drift-corrected randomizing sequence of clock division factors 201; and FIG. 3 illustrates example division factor arbitration 300, including a drift-controlled arbitration feedback loop 320A/320B, with clock drift accumulation 321 (with respect to a target average division 322), and comparison of accumulated drift with thresholds (determined by FIFO depth) 324/324A/324B, enabling selective alteration 310/310A/310B of the randomizing sequence of division factors 301 (example, {3, 4, 5}) passed to the non-uniform digital clock divider.

FIG. 4A illustrates clock division by an example sequence of clock division factors {3, 4, 5} for an average clock division of 4, such as used in FIGS. 2/3; and FIG. 4B illustrates clock division by an alternate example sequence of clock division factors {3.5, 4, 4.5} for an average clock division of 4 (for {3.5 and {4.5} the negative edge of the clock is used).

FIG. 6A illustrates randomized clock division for CLK_by_4 (401(×4)), and division by 2 of CLK_by_4 to generate CLK_by_8 (401(×8)); and FIG. 6B illustrates randomized clock division of CLK_by_4 with and without clock phasing.

FIG. 7A illustrates an implementation of randomized (non-uniform) fractional division of a source clock, including a front-end probability mapper 122 to the division selector 130 (FIG. 2); and FIG. 7B provides an example signal (frequency-amplitude) plot illustrating randomized fractional clock division 501 according to the Disclosure, including spur reduction.

DETAILED DESCRIPTION

This Description and the Drawings constitute a Disclosure, including design examples and implementations, and including illustrating various technical features and advantages for: digital clock generation for a digital clock domain receiving data through a FIFO interface, with randomized division (integer or fractional) of a source clock based on a drift-corrected randomizing sequence of clock division factors, so that clock drift is bounded based on a selected FIFO depth.

An example application is RF TX and/or RX analog/digital signal chains (such as an RF TX/RX transceiver), with a FIFO A/D interface for data transfers to/from the digital signal chain (clock domain). In other applications, the digital clock domain can be interfaced (through the FIFO) to another digital clock domain.

As used in this Disclosure, (a) randomized clock division means non-uniform clock division based on a randomizing sequence of random or pseudorandom division factors, such as generated from a defined set of clock division factors using a randomizing linear feedback shift register (LFSR), and (b) a drift-corrected randomizing sequence of clock division factors means randomized clock division in which the randomizing sequence of clock division factors is selectively through feedback based on accumulated clock drift, altered so that, for a given FIFO depth, maximum clock drift is bounded.

In brief overview, a digital clock generator for a digital clock domain interfaced to another clock domain through a FIFO, includes division selector circuitry to provide an input randomizing sequence of clock division factors, selected from a defined set of clock division factors corresponding to a target average clock division, and division arbitration circuitry to generate a drift-corrected randomizing sequence of clock division factors, based at least in part on the input randomizing sequence of clock division factors, and an accumulated drift correction signal. A clock drift control loop generates the accumulated drift correction signal, based at least in part on an accumulated clock drift relative to the target average clock division. Clock generation can be based on randomized division with the drift-corrected randomizing sequence of clock division factors. The drift-corrected randomizing sequence of clock division factors can be generated so that clock drift is bounded based on a FIFO depth.

Figure 1:
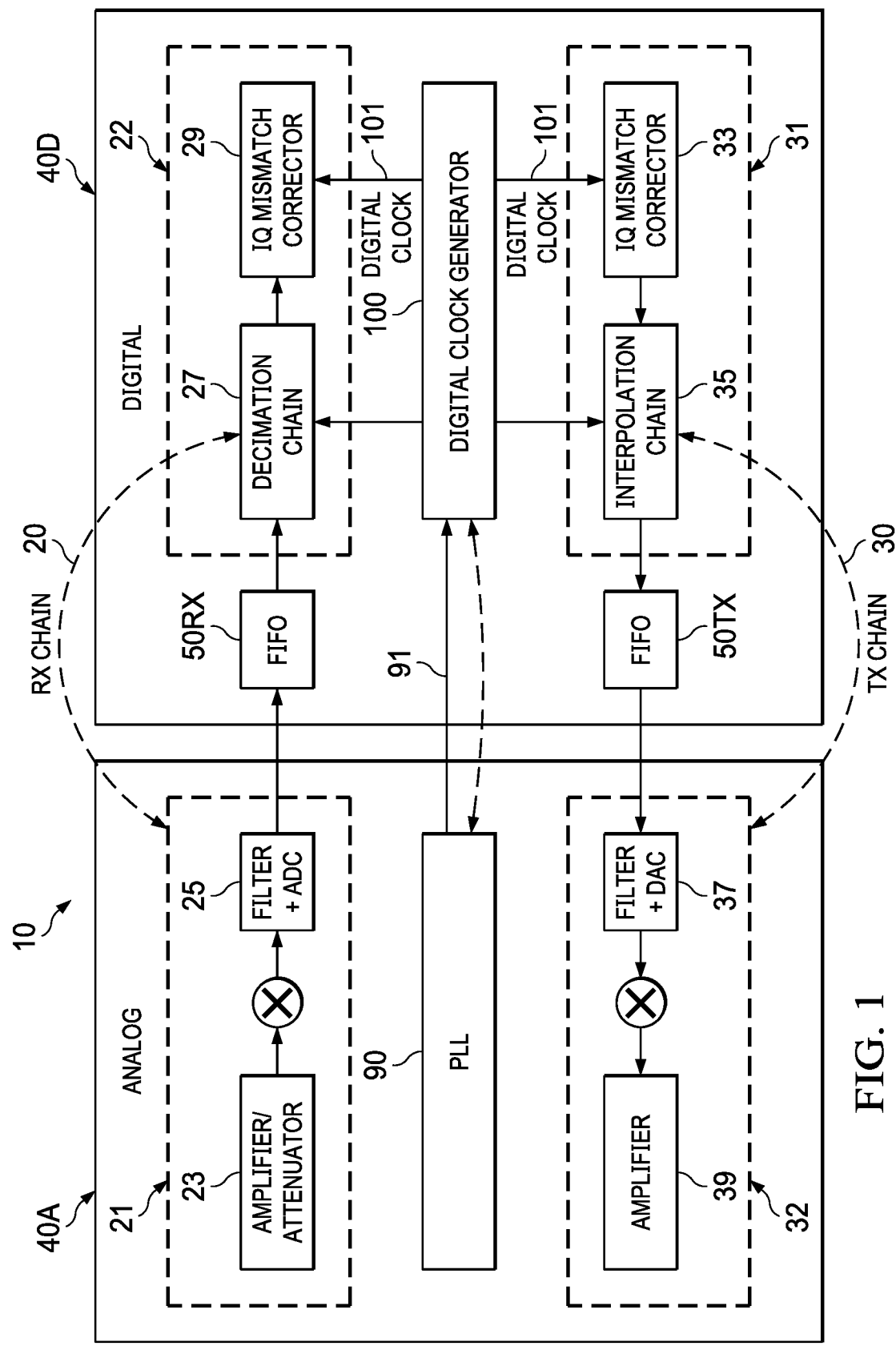
FIG. 1 illustrates an example RF TX/RX transceiver 10 with an RX chain 20 and a TX chain 30, including analog and digital clock domains 40A/40D, and including FIFO interfaces 50RX/50TX between the analog/digital clock domains, and including digital clock generation 100 according to the Disclosure, providing randomized division of a source clock to generate non-uniform digital clocks 101 for the digital clock domain 40D.

FIG. 1 illustrates an example RF TX/RX transceiver 10 with an RX signal chain 20 and a TX signal chain 30. RX signal chain 20 includes an analog chain 21 and a digital chain 22. TX signal chain 30 includes a digital chain 31 and an analog chain 32. The analog chains 21/32 and the digital chains 22/31 are in separate analog and digital clock domains 40A and 40D.

RX signal chain 20 includes: in analog chain 21 (clock domain 40A), an RF input amplifier/attenuator 23 (such as a digital step attenuator), and an ADC 25; and in digital chain 22 (clock domain 40D), a decimation chain 27 and IQ mismatch corrector. TX signal chain 30 includes: in digital chain 31 (clock domain 40D), an IQ mismatch corrector (pre-distorter) 33 and interpolation chain 35; and in analog chain 32 (clock domain 40A), a DAC 37 and RF power amplifier 39.

In the digital clock domain 40D, RX signal chain 20 includes a FIFO interface 50RX between the analog and digital chains 21/22, receiving the digital output from ADC 25, and TX signal chain 30 includes a FIFO interface 50TX between the digital and analog chains 31/32, providing digital output to DAC 37. In the analog clock domain 40A, a PLL 90 generates a source clock used by the RX and TX analog chains 21/32, and supplied to a digital clock generator 100 in the digital clock domain 40D.

FIFOs 50RX/50TX are designed for a given FIFO depth to avoid overflow/underflow. FIFO depth represents a design trade-off between avoiding overflow/underflow and die area.

According to aspects of the Disclosure, digital clock generator 100 uses randomized division of a source clock to generate non-uniform digital clocks 101 for the digital clock domain 40D, based on a drift-corrected randomizing sequence of clock division factors, to ensure that, for any given FIFO depth, maximum clock drift is bounded.

Figure 2:
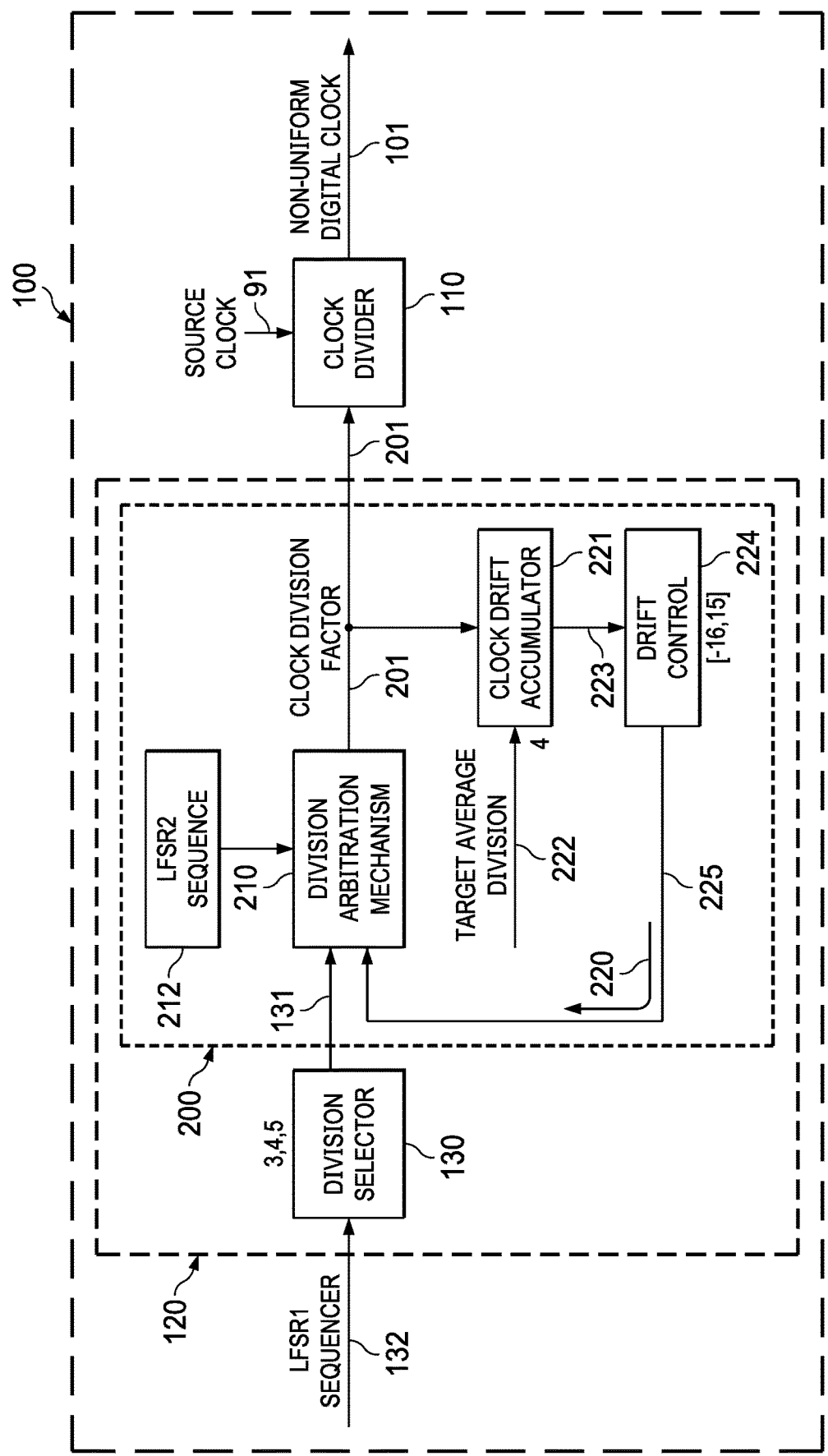
FIGS. 2 and 3 illustrate example digital clock generation according to the Disclosure, with randomized (non-uniform) division of a source clock based on a drift-corrected randomizing sequence of clock division factors (example, {3, 4, 5}), including feedback-controlled alteration of the randomizing sequence, so that clock drift can be bounded based on a selected FIFO depth.
Figure 3:
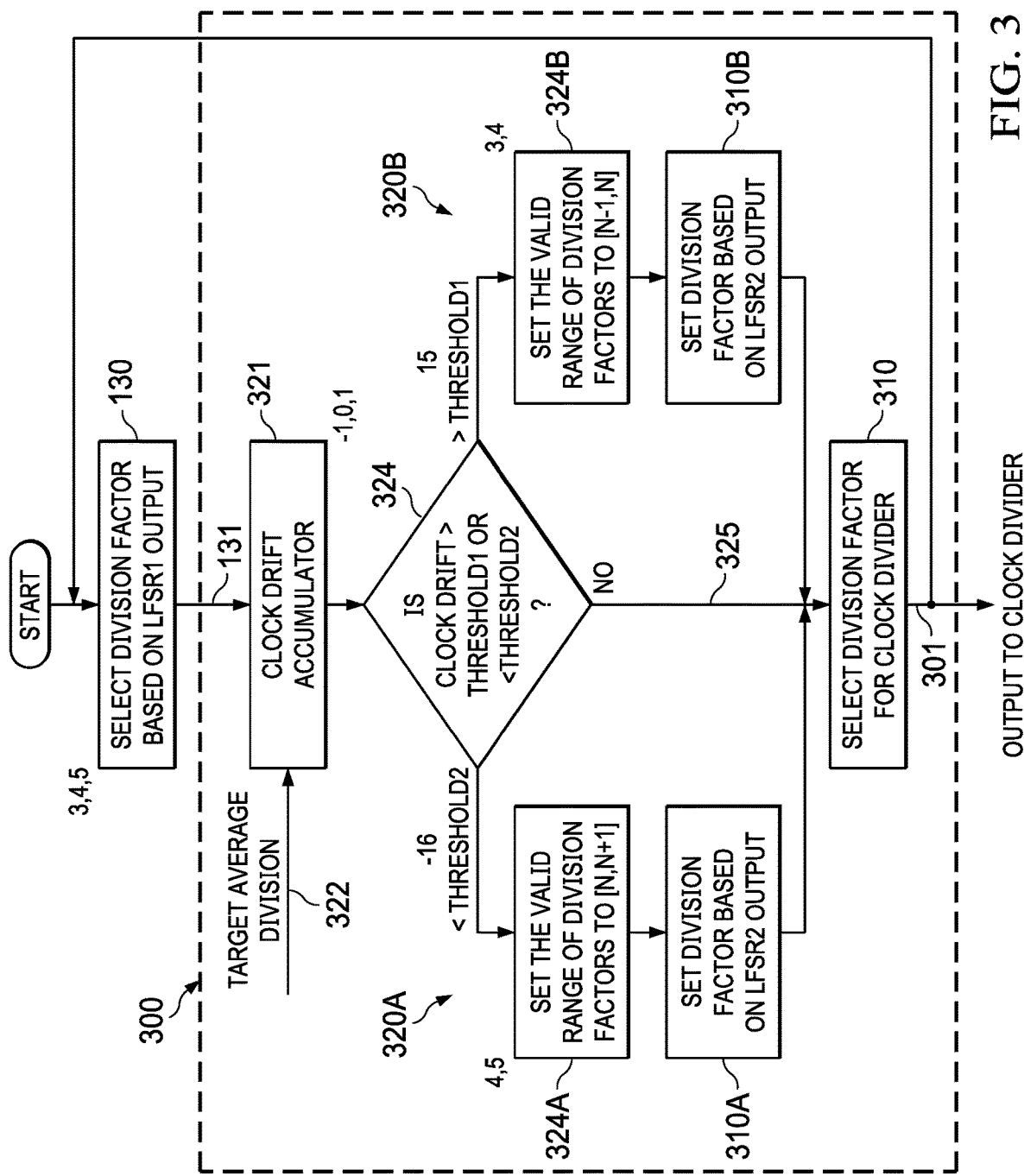

FIGS. 2 and 3 illustrate example digital clock generation according to the Disclosure, with randomized (non-uniform) division of a source clock based on a drift-corrected randomizing sequence of clock division factors, including feedback-controlled alteration of the randomizing sequence, to ensure that, for any given FIFO depth, maximum clock drift is bounded.

FIG. 2 illustrates an example digital clock generator 100 including a randomized non-uniform clock divider 110, and a clock division factor block 120. The clock division factor block 120 includes a randomized division factor selector 130, and a division factor arbitration block 200. Clock division factor block 130 generates a randomized clock division factor 131 based on an LFSR1 input 132.

The example division factor arbitration block 200 includes a division factor arbitration mechanism 210, that receives the randomized clock division factor from the division factor selector 130 (based on the LFSR1 input), and generates a randomized drift-corrected clock division factor 201 for input to clock divider 110. Division factor arbitration mechanism also receives an LFSR2 input 212.

The division factor arbitration block 200 implements a drift-control arbitration feedback loop 220 that includes, in addition to the division factor arbitration mechanism 210, a clock drift accumulator 221 and drift control 224, providing feedback drift control input 225 to the division factor arbitration mechanism 210. Clock drift accumulator 221 receives a target average division input 222, and generates an accumulated clock drift signal 223. Based on the accumulated clock drift 223, drift control 224 generates the feedback drift control input 225 to the division factor arbitration mechanism 210.

The division arbitration mechanism 210 and the drift-control arbitration feedback loop 220 operate to alter the clock division factor randomizing sequence, based on clock drift accumulation, and generate the drift-corrected randomizing sequence of clock division factors 201.

FIG. 3 illustrates example operation of the division factor arbitration block 200 of FIG. 2. Division factor arbitration 300 receives the randomized division clock division factor 131 from the randomized division factor selector 130, and implements a drift-controlled arbitration feedback loop 320A/320B to generate the drift corrected clock division factor 301.

Division factor arbitration 300 (drift-controlled arbitration feedback loop 320A/320B), includes clock drift accumulation 321 and accumulated drift comparison 324. Clock drift accumulation 321 is with respect to a target average division 322. Accumulated drift is compared 324 with thresholds determined by FIFO depth, providing feedback drift control 324A/324B for clock division arbitration 310. The clock division arbitrator provides selective alteration 310A/310B of the randomizing sequence of division factors (drift corrected) 301 passed to the non-uniform digital clock divider.

That is, referring to FIGS. 2 and 3, the randomized sequence of clock division factors 131 (based on LFSR1) is drift-corrected by the drift-controlled arbitration feedback loop 320 to alter the randomizing sequence of clock division factors to generate the drift corrected clock division factors passed to the clock division, to ensure that for any given FIFO depth the maximum clock drift is bounded.

The division selector 130 receives LFSR1, and generates a randomized sequence of clock division factors from a given (defined) set of integer division factors. For example, for an average division by N, the division factors can be {N−1, N, N+1, for example 3, 4, 5} generated in a randomized order with a probability distribution such that the mean is N.

Clock drift with respect to the target average division 222/322 is accumulated. The accumulated drift is compared with thresholds 224/324, and a feedback drift control/correction 225 is input to the division arbitration mechanism 210/310 (310A/310B). The thresholds are determined by FIFO depth.

Division arbitration mechanism 210 receives the randomized sequence of clock division factors 131 from the division selector 130, and an input LFSR2 sequence 212, and generates the drift-corrected randomizing sequence of clock division factors 201/301, with control for maximum clock drift based on the feedback drift control/correction provided by the drift-control arbitration feedback loop 220 (320A/320B). That is, drift-control clock division arbitration 200/300 selects the clock division factors 201/301 passed to the clock divider 110, including altering the randomized sequence from the division selector 130/131 based on the accumulated drift 221/321 and feedback drift control 220/320A/320B. In addition, division selector 130 can be configured to adjust the input randomizing sequence of division factors from LFSR1 (selected from a defined set of clock division factors) based on the drift control signal 220/320A/320B.

Figure 4A:
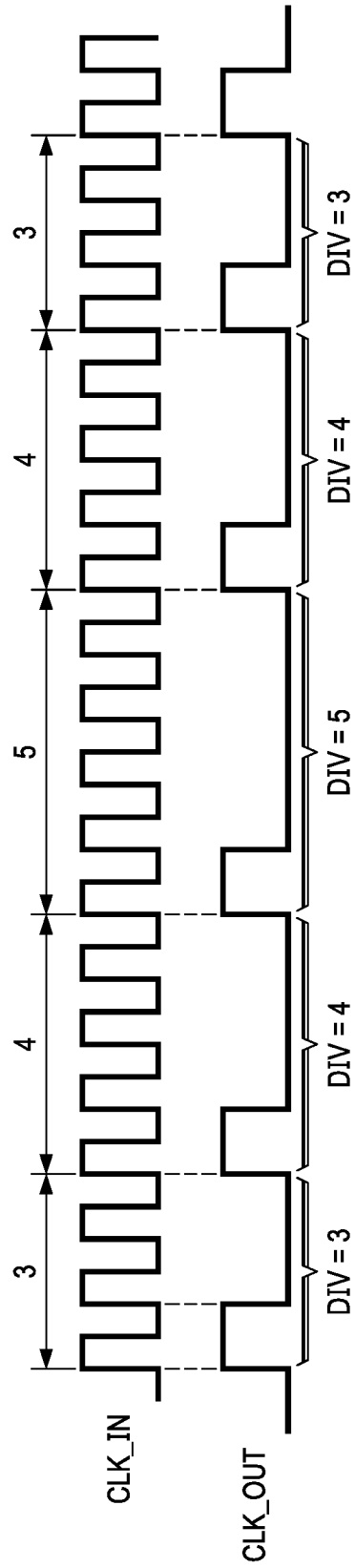
FIGS. 4A-4B provide example clock signal waveforms for clock division factors.
Figure 4B:
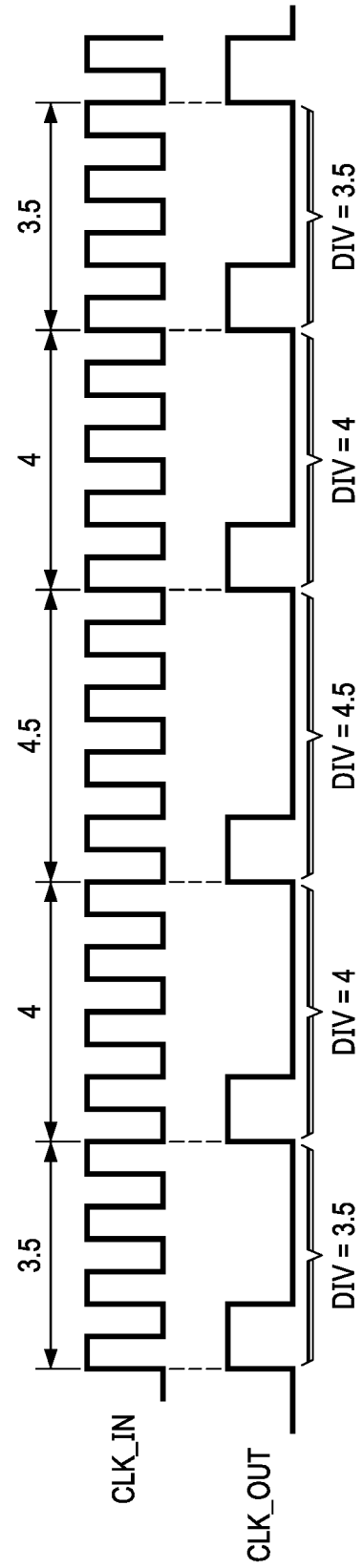

FIGS. 4A-4B provide example clock signal waveforms for clock division factors. FIG. 4A illustrates clock division (referenced to Clk_in) by an example sequence of clock division factors {3, 4, 5} for an average clock division of 4, such as used in FIGS. 2/3. FIG. 4B illustrates clock division (reference to Clk_in) by an alternate example sequence of clock division factors {3.5, 4, 4.5} for an average clock division of 4—for {3.5} and {4.5}, the negative edge of the clock is used.

Figure 5:
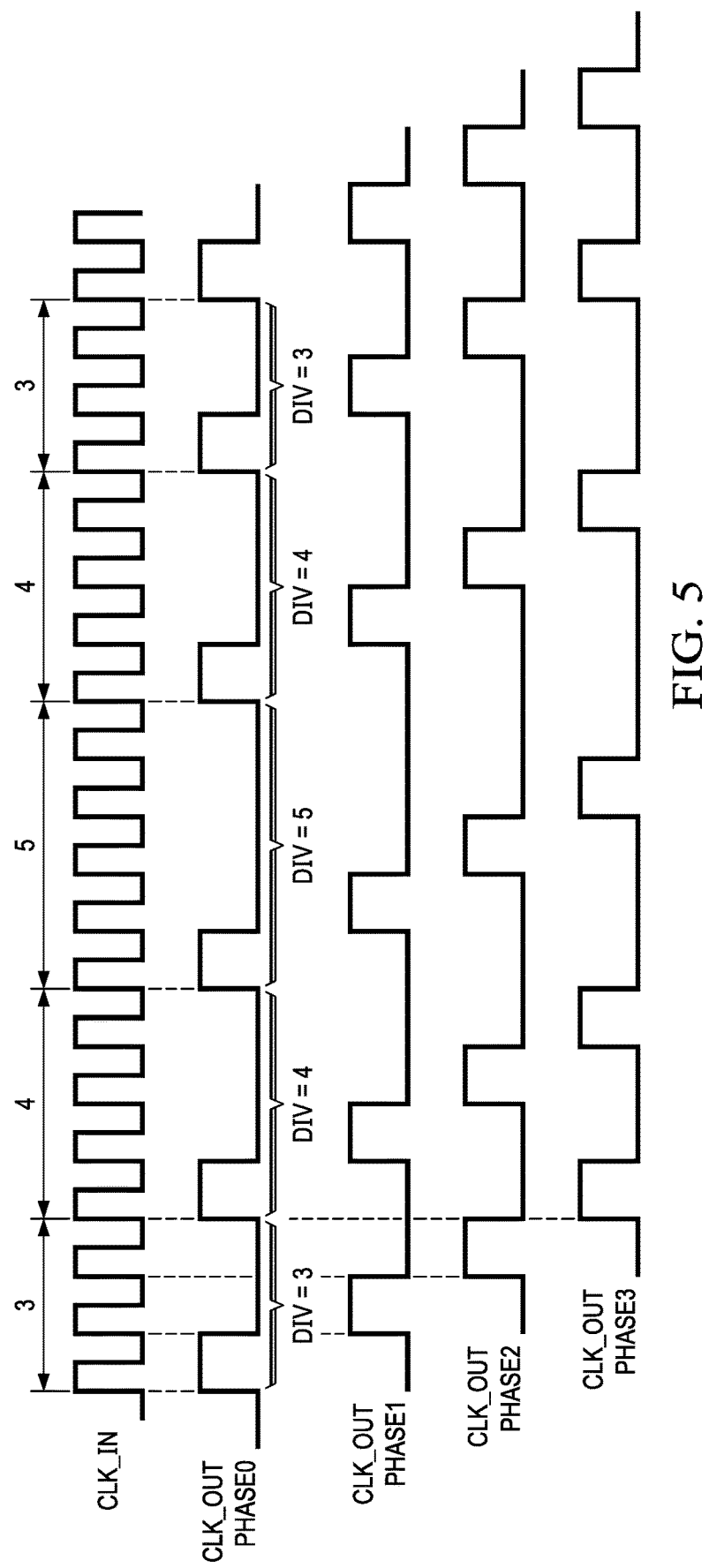
FIG. 5 illustrates an example clock phasing, for the example sequence of division factors {3, 4, 5}.

FIG. 5 illustrates an example clock phasing (referenced to Clk_in) for the example sequence of division factors {3, 4, 5}. The illustrated example is four-phase clock generation, with Clock Phases 0-3. Each clock phase is synchronized with a period of Clk_in, and with a Clock Phase period determined by the example division factors {3, 4, 5}. That is, as illustrated, each of the initial Clock Phases 0-3 has a period determined by division factor {3}, each of the next Clock Phases 0-4 has a period determined by division factor {4}, followed by division factors 5 and then 3 (for an average of 4).

Figure 6A:
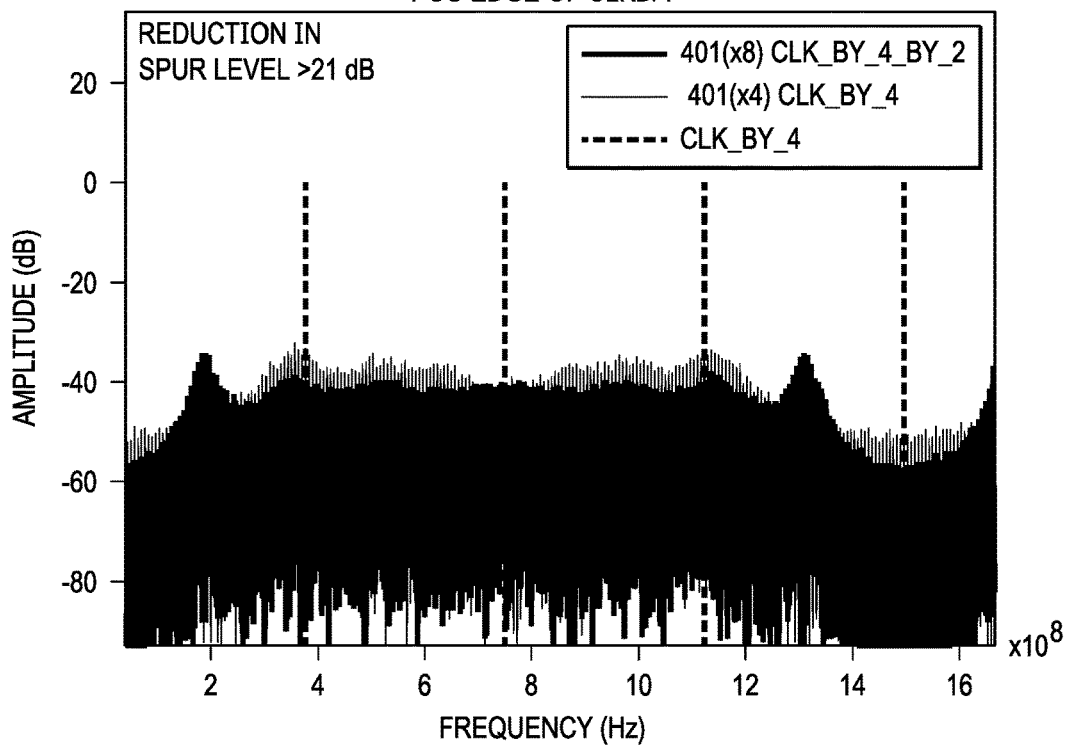
FIGS. 6A and 6B provide example signal (frequency-amplitude) plots 401 illustrating results of randomized clock division according to the Disclosure, based on randomized division of a source clock with feedback-controlled alteration of the randomized sequencing of clock division factors, including spur reduction.
Figure 6B:
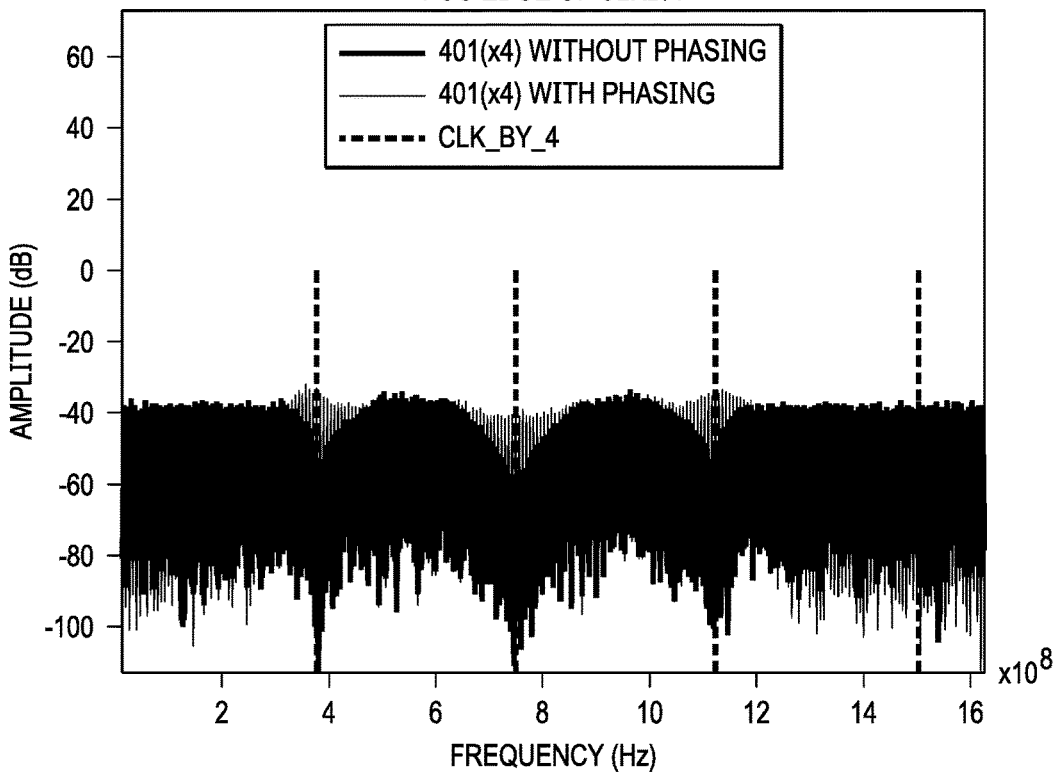
Figure 7A:
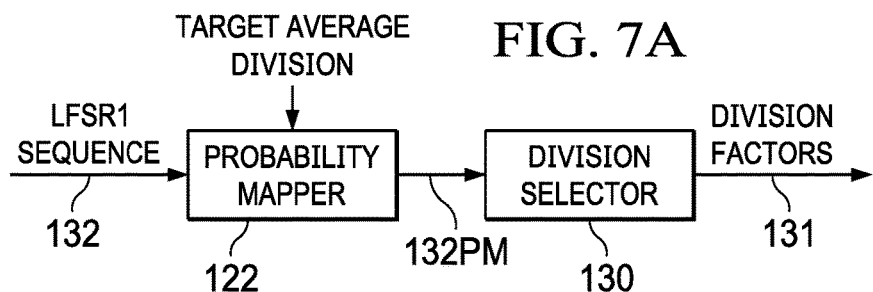
FIGS. 7A-7B illustrate a fractional division design example for digital clock generation according to the Disclosure, with randomized (non-uniform) fractional division of a source clock based on a drift-corrected randomizing sequence of clock division factors based on probability mapping with a target average division.
Figure 7B:
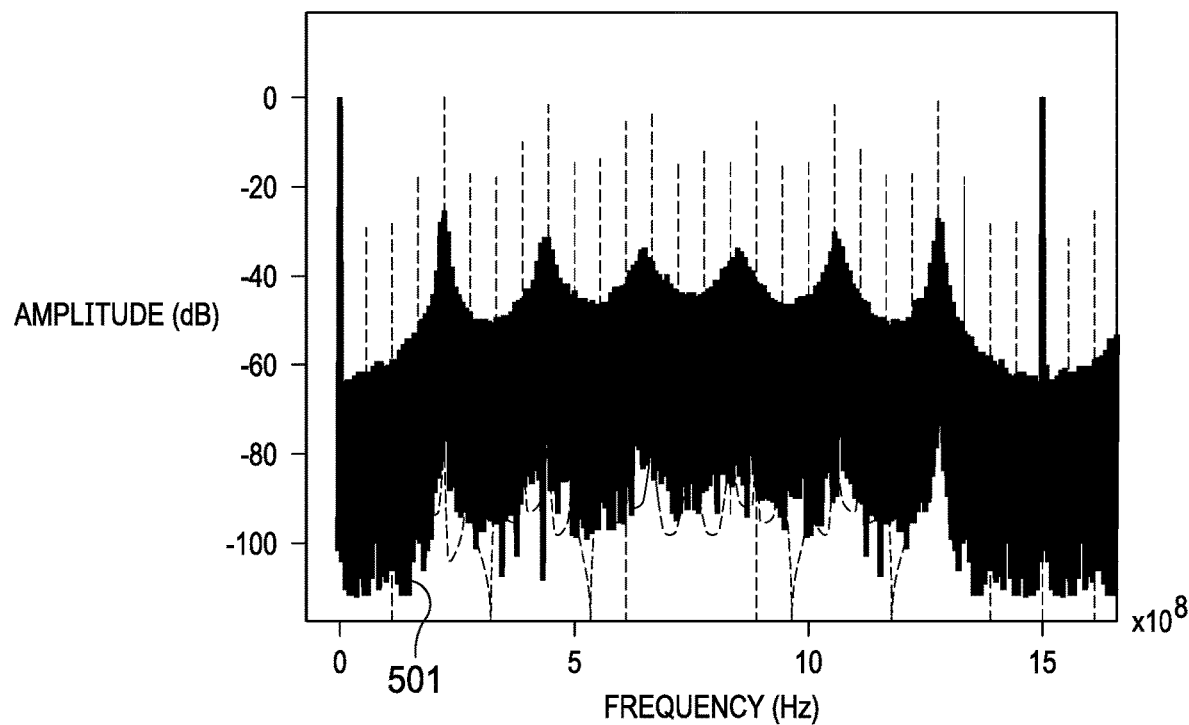

FIGS. 6A and 6B provide example signal (frequency-amplitude) plots 401 illustrating results of randomized clock division according to the Disclosure, based on randomized division of a source clock with feedback-controlled alteration of the randomized sequencing of clock division factors, including spur reduction.

FIG. 6A illustrates results for randomized clock division of CLK_by_4 at 401(×4), and division of CLK_by_4 by 2 to generate CLK_by_8 at 401(×8). FIG. 6B illustrates results for randomized clock division by 4, to generate CLK_by_4 at 401(×4), with and without clock phasing.

Drift-controlled clock division factor arbitration 200/300 effectively alters the LFSR clock division sequence. As a design example, note the alteration of the LFSR1 randomized sequence at position 5 (5→3) based on feedback drift control to the division factor arbitration mechanism, and the LFSR2 sequence LFSR1 sequence: 5 4 4 5 5 3 5 4 5 3

Division Arbitration Mechanism: 5 4 4 5 3 3 5 4 5 3

That is, based on the LFSR1 sequence, if the accumulated drift (jitter) will cause the FIFO depth to be exceeded, then based on the feedback drift control (correction), the sequence is altered. To prevent a FIFO underflow/overflow condition a set of valid division factors can be provided by LFSR2. For example, at position five, the set of valid division factors to prevent FIFO underflow/overflow is {3,4}, with the valid division factor selected based on the LFSR2 sequence: if LFSR2 output is 0, division factor 3 is selected, and if LFSR2 output is 1 division factor 4 is selected. In an alternate method, the valid division factor can be selected as either 3 or 4 without using a LFSR2 sequence. As a design example, for FIFO depth=32, clock spurs can be reduced by 21 dB compared to a uniform clock CLK_by_4 (for example, a CLK at 1.5 GHz and CLK_by_4 at 375 MHz).

FIGS. 2-3 illustrate a design example for a non-uniform clock with an average frequency of CLK_by_4. An LFSR1 randomly selects division factors from the set of integers {3, 4, 5}: For an example CLK_by_4, a target average division is 4. The clock drift accumulator 221/321 accumulates the difference between the clock division factor and target average division. For FIFO depth=32, the output of clock drift accumulator is in the range [−16 to 15].

The clock drift accumulator output is compared to thresholds (corresponding to FIFO depth) to determine the FIFO overflow/underflow status, and generate the drift-corrected clock division factors passed to the clock divider 110: (1) If the clock drift accumulator output is <=−16, the valid range of division factors is {4, 5}; or (2) If the clock drift accumulator output is >=15, the valid range of division factors is {3, 4}; or (3) If the clock drift accumulator is between [−16, 15], the (unadjusted) randomized division factor based on the randomized sequence from the division selector 130 (using LFSR1) is selected.

As a generalization:

Let $d_n$ be the division factor chosen based on the LFSR sequence at time instant n.

Let $c_n$ be the final clock division factor at the output of Division Arbitration Mechanism which is eventually used in the Clock divider module.

Based on the sequence of past selected division factors, $c_n$, and the given FIFO depth the current FIFO status is determined.

For the current FIFO status, the Division Arbitration Mechanism determines a set of valid division factors.

If division factor from LFSR sequence, $d_n$, belongs to the set of valid division factors then $d_n$ is selected as the final division factor.

Else, $d_n$ is overridden by one of valid division factors.

In one example implementation, any one of the valid division factors can be selected randomly. This PROCESS maintains FIFO stability, ensuring that, for a given FIFO depth, maximum clock drift is bounded.

FIGS. 6A-6B illustrate a fractional division design example for digital clock generation according to the Disclosure, with randomized (non-uniform) fractional division of a source clock, based on a drift-corrected randomizing sequence of clock division factors using probability mapping with a target average division. The randomized division of a source clock with a drift-corrected randomizing sequence of fractional clock division factors ensures that, for a given FIFO depth, maximum clock drift is bounded.

FIG. 6A illustrates an implementation of randomized (non-uniform) fractional division of a source clock, including a front-end probability mapper 122 to the division selector 130.

FIG. 6B provides an example signal (frequency-amplitude) plot illustrating randomized fractional clock division 501 according to the Disclosure, including spur reduction.

Fractional division can performed based on probability mapping 122. Fractional division can be characterized as clock division by P/Q with P and Q being co-prime integers. For a given fraction P/Q where P and Q are integers, integers {N−1,N,N+1} are chosen with probability $k_1/Q$, $k_2/Q$ and $(Q-k_1-k_2)/Q$ respectively with $k_1$ and $k_2$ being integers less than Q. Also, $k_1$ and $k_2$ are integers which satisfy $(N-1)*k_1+N*k_2+(N+1)*(Q-k_1-k_2)=P$.

For example, to divide a source clock by 6.75, the set of division factors are {5, 6, 7}. For this example, P=27 and Q=4, and the integers $k_1=0$, $k_2=1$ are chosen such that the LFSR output is mapped to choose division factor {6} with probability 1/4 and {7} with probability 3/4. For FIFO depth=32 [−16, 15] and considering power in RBW=200 KHz, randomized division of a source clock with a drift-corrected randomizing sequence of clock division factors according to the Disclosure enables >15 dB reduction in the most significant spur that would be present, for example, with a fixed sequence (pulse swallowing) approach, for example with a fixed sequence of clock division factors {6, 7, 7, 7}.

The Disclosure provided by this Description and the Figures sets forth example designs and applications illustrating aspects and features of the invention, and does not limit the scope of the invention, which is defined by the claims. Known circuits, connections, functions and operations are not described in detail to avoid obscuring the principles and features of the Disclosed example designs and applications. This Disclosure can be used by ordinarily skilled artisans as a basis for modifications, substitutions and alternatives, including adaptations for other applications.

The invention claimed is:

1. A circuit for use in generating a digital clock for a digital clock domain interfaced to another clock domain through a FIFO (first in first out) component, based on randomized division of a source clock, the circuit comprising:

division selector circuitry to provide an input randomizing sequence of clock division factors, selected from a defined set of clock division factors corresponding to a target average clock division value; and division arbitration circuitry to generate a drift-corrected randomizing sequence of clock division factors, based at least in part on:
  the input randomizing sequence of clock division factors, and an accumulated drift correction signal; and
a clock drift control loop to generate the accumulated drift correction signal, based at least in part on an accumulated clock drift value relative to the target average clock division value.

2. The circuit of claim 1, further comprising a clock generator circuit, including the circuit, to generate the digital clock from the source clock based on randomized division with the drift-corrected randomizing sequence of clock division factors.

3. The circuit of claim 1, wherein the FIFO component is configured with a defined FIFO depth, and wherein the drift-corrected randomizing sequence of clock division factors is generated so that clock drift is bounded based on the defined FIFO depth.

4. The circuit of claim 1, wherein the input randomizing sequence of clock division factors is generated with a linear feedback shift register.

5. The circuit of claim 4, wherein:
the division arbitration circuitry generates each drift-corrected clock division factor of the drift-corrected randomizing sequence of clock division factors from a valid subset of the randomizing sequence of clock division factors determined based at least in part on the accumulated drift correction signal;
the drift-corrected clock division factor selected from the valid subset of the randomizing sequence of clock division factors based on a second linear feedback shift register.

6. The circuit of claim 1, wherein the clock drift control loop includes:
clock drift accumulator circuitry to accumulate clock drift relative to the target division value using first and second clock-drift thresholds associated with respective first and second threshold subsets of the defined set of clock division factors; and
drift correction circuitry to generate the accumulated drift correction signal based on the accumulated clock drift relative to the first and second clock-drift thresholds.

7. The circuit of claim 2, wherein:
the randomized division of the source clock is fractional based at least in part on a probability mapping of the input randomized sequence of clock division factors, and the target average division value.

8. The circuit of claim 2, wherein:
the clock generator circuit to generate the digital clock from the source clock using clock phasing;
during each clock phase, the clock generator circuit to perform randomized division with the drift-corrected randomizing sequence of clock division factors.

9. The circuit of claim 1, for use in a radio frequency communications device that is one of a receiver device or a transmitter device, wherein the device includes:
an analog signal chain in an analog clock domain, and a digital signal chain in a digital clock domain;
an interface between the analog clock domain and the digital clock domain, the interface including the FIFO component; and
a digital clock generator including the circuit, to generate the digital clock from the source clock based on randomized division with the drift-corrected randomizing sequence of clock division factors.

10. A radio frequency communications device, comprising:
an analog signal chain in an analog clock domain, and a digital signal chain in a digital clock domain;
an interface circuit between the analog clock domain and the digital clock domain, the interface including a FIFO component; and
a digital clock generator circuit to generate the digital clock from a source clock, the digital clock generator circuit including:
  division selector circuitry to provide an input randomizing sequence of clock division factors, selected from a defined set of clock division factors corresponding to a target average clock division value, and
  division arbitration circuitry to generate a drift-corrected randomizing sequence of clock division factors, based at least in part on:
    the input randomizing sequence of clock division factors, and an accumulated drift correction signal; and
  a clock drift control loop to generate the accumulated drift correction signal, based at least in part on an accumulated clock drift value relative to the target average clock division value.
the digital clock generator circuit to generate the digital clock from the source clock based on randomized division with the drift-corrected randomizing sequence of clock division factors.

11. The device of claim 10, wherein the FIFO component is configured with a defined FIFO depth, and wherein the drift-corrected randomizing sequence of clock division factors is generated so that clock drift is bounded based on the defined FIFO depth.

12. The device of claim 10, wherein the input randomizing sequence of clock division factors is generated with a linear feedback shift register.

13. The device of claim 12, wherein:
the division arbitration circuitry generates each drift-corrected clock division factor of the drift-corrected randomizing sequence of clock division factors from a valid subset of the randomizing sequence of clock division factors determined based at least in part on the accumulated drift correction signal;
the drift-corrected clock division factor selected from the valid subset of the randomizing sequence of clock division factors based on a second linear feedback shift register.

14. The circuit of claim 10, wherein the clock drift control loop includes:
clock drift accumulator circuitry to accumulate clock drift relative to the target division value using first and second clock-drift thresholds associated with respective first and second threshold subsets of the defined set of clock division factors; and
drift correction circuitry to generate the accumulated drift correction signal based on the accumulated clock drift relative to the first and second clock-drift thresholds.

15. The device of claim 10, wherein:
the randomized division of the source clock is fractional based at least in part on a probability mapping of the input randomized sequence of clock division factors, and the target average division value.

16. The device of claim 10, wherein:
the clock generator circuit to generate the digital clock from the source clock using clock phasing;

during each clock phase, the clock generator circuit to perform randomized division with the drift-corrected randomizing sequence of clock division factors.

17. The device of claim 10, wherein the device is one of a radio frequency transmitter or a radio frequency receiver.

18. A method of generating a digital clock for a digital clock domain interfaced to another clock domain through a FIFO (first in first out) component, based on randomized division of a source clock, the method comprising:
generating an input randomizing sequence of clock division factors, selected from a defined set of clock division factors corresponding to a target average clock division value;
generating an accumulated drift correction signal, based at least in part on an accumulated clock drift value relative to the target average clock division value; and
generating a drift-corrected randomizing sequence of clock division factors, based at least in part on:
the input randomizing sequence of clock division factors, and
the accumulated drift correction signal.
generating the digital clock from the source clock based on randomized division with the drift-corrected randomizing sequence of clock division factors.

19. The method of claim 18, wherein the FIFO component is configured with a defined FIFO depth, and wherein the drift-corrected randomizing sequence of clock division factors is generated so that clock drift is bounded based on the defined FIFO depth.

20. The method of claim 18, further comprising:
generating the input randomizing sequence of clock division factors based on a first linear feedback shift register; and
generating each drift-corrected clock division factor of the drift-corrected randomizing sequence of clock division factors from a valid subset of the randomizing sequence of clock division factors determined based at least in part on the accumulated drift correction signal;
the drift-corrected clock division factors selected from the valid subset of the randomizing sequence of clock division factors based on a second linear feedback shift register.

21. The method of claim 18, wherein generating the accumulated drift correction signal includes:
accumulating a clock drift relative to the target division value using first and second clock-drift thresholds associated with respective first and second threshold subsets of the defined set of clock division factors; and
generating the accumulated drift correction signal based on the accumulated clock drift relative to the first and second clock-drift thresholds.

22. The method of claim 18, further comprising:
generating the digital clock from the source clock using clock phasing; and
during each clock phase, performing randomized division with the drift-corrected randomizing sequence of clock division factors.

23. The method of claim 18, for use in a radio frequency communications device that is one of a receiver device or a transmitter device, wherein the device includes:
an analog signal chain in an analog clock domain, and a digital signal chain in a digital clock domain; and
an interface between the analog clock domain and the digital clock domain, the interface including the FIFO component.

* * * * *